(12) United States Patent
Fan et al.

(10) Patent No.: US 7,372,151 B1
(45) Date of Patent: May 13, 2008

(54) BALL GRID ARRAY PACKAGE AND PROCESS FOR MANUFACTURING SAME

(75) Inventors: Chun Ho Fan, Sham Tseng (HK); Neil McLellan, Danville, CA (US); Kwok Cheung Tsang, N.T. (HK)

(73) Assignee: ASAT Ltd., Tsuen Wan, New Territories (HK)

( * ) Notice: Subject to any disclaimer, the term of this patent is extended or adjusted under 35 U.S.C. 154(b) by 417 days.

(21) Appl. No.: 10/660,611

(22) Filed: Sep. 12, 2003

(51) Int. Cl.
*H01L 23/48* (2006.01)

(52) U.S. Cl. .................. 257/738; 257/777; 257/780; 257/E23.069

(58) Field of Classification Search .............. 257/678, 257/693, 700, 707, 711, 713, 734–738, 787, 257/788, 777–786, E23.069, E21.503, E21.511; 438/123–127, 612–614, 617
See application file for complete search history.

(56) References Cited

U.S. PATENT DOCUMENTS

| | | | |
|---|---|---|---|
| 4,698,662 A | 10/1987 | Young et al. |
| 5,172,213 A | 12/1992 | Zimmerman |
| 5,311,060 A | 5/1994 | Rostoker et al. |
| 5,329,423 A | 7/1994 | Scholz |
| 5,339,216 A | 8/1994 | Lin et al. |
| 5,435,732 A | 7/1995 | Angulas et al. |
| 5,444,025 A | 8/1995 | Sono et al. |
| 5,493,153 A | 2/1996 | Arikawa et al. |
| 5,609,889 A | 3/1997 | Weber |
| 5,610,442 A | 3/1997 | Schneider et al. |
| 5,639,694 A | 6/1997 | Diffenderfer et al. |
| 5,650,663 A | 7/1997 | Parthasarathi |
| 5,679,978 A | 10/1997 | Kawahara et al. |
| 5,705,851 A | 1/1998 | Mostafazadeh et al. |
| 5,736,785 A | 4/1998 | Chiang et al. |
| 5,773,362 A | 6/1998 | Tonti et al. |
| 5,877,552 A | 3/1999 | Chiang |
| 5,898,219 A | 4/1999 | Barrow |
| 5,901,043 A | 5/1999 | Lin et al. |

(Continued)

FOREIGN PATENT DOCUMENTS

DE 100 15 962 A1 10/2001

(Continued)

OTHER PUBLICATIONS

U.S. Appl. No. 10/323,657, Chun Ho Fan et al., "Process for Manufacturing Ball Grid Array Package", filed Dec. 20, 2002.

(Continued)

*Primary Examiner*—Brook Kebede
(74) *Attorney, Agent, or Firm*—Morrison & Foerster LLP

(57) ABSTRACT

A process for manufacturing an integrated circuit package includes forming a plurality of solder balls on a first surface of a substrate and mounting a semiconductor die to the substrate such that bumps of the semiconductor die are electrically connected to conductive traces of the substrate. The semiconductor die and the solder balls are encapsulated in an overmold material on the substrate such that portions of the solder balls are exposed. A ball grid array is formed such that bumps of the ball grid array are electrically connected to the conductive traces and the integrated circuit package is singulated.

8 Claims, 14 Drawing Sheets

U.S. PATENT DOCUMENTS

| | | | |
|---|---|---|---|
| 5,977,626 A | 11/1999 | Wang et al. | |
| 5,985,695 A | 11/1999 | Freyman et al. | |
| 5,986,885 A | 11/1999 | Wyland | |
| 6,016,013 A | 1/2000 | Baba | |
| 6,037,658 A | 3/2000 | Brodsky et al. | |
| 6,075,712 A | 6/2000 | McMahon | |
| 6,175,161 B1 | 1/2001 | Goetz et al. | |
| 6,181,569 B1 | 1/2001 | Chakravorty | |
| 6,194,250 B1 * | 2/2001 | Melton et al. | 438/126 |
| 6,236,568 B1 | 5/2001 | Lai et al. | |
| 6,251,706 B1 | 6/2001 | Paniccia | |
| 6,308,938 B1 * | 10/2001 | Futakuchi | 257/780 |
| 6,323,066 B2 | 11/2001 | Lai et al. | |
| 6,388,335 B1 | 5/2002 | Lam | |
| 6,414,385 B1 | 7/2002 | Huang et al. | |
| 6,462,405 B1 | 10/2002 | Lai et al. | |
| 6,525,421 B1 | 2/2003 | Chia et al. | |
| 6,602,737 B2 * | 8/2003 | Wu | 438/122 |
| 6,631,078 B2 | 10/2003 | Alcoe et al. | |
| 6,656,770 B2 | 12/2003 | Atwood et al. | |
| 6,707,167 B2 * | 3/2004 | Huang et al. | 257/790 |
| 6,737,755 B1 | 5/2004 | McLellan et al. | |
| 6,800,948 B1 | 10/2004 | Fan et al. | |
| 6,818,472 B1 | 11/2004 | Fan et al. | |
| 6,818,980 B1 * | 11/2004 | Pedron, Jr. | 257/706 |
| 6,882,042 B2 * | 4/2005 | Zhao et al. | 257/706 |
| 2001/0015492 A1 | 8/2001 | Akram et al. | |
| 2002/0005578 A1 | 1/2002 | Kodama et al. | |
| 2002/0006718 A1 | 1/2002 | Distefano | |
| 2002/0113308 A1 * | 8/2002 | Huang et al. | 257/717 |
| 2002/0180035 A1 | 12/2002 | Huang et al. | |
| 2002/0185734 A1 | 12/2002 | Zhao et al. | |
| 2003/0034569 A1 | 2/2003 | Caletka et al. | |
| 2003/0075812 A1 | 4/2003 | Cheng et al. | |
| 2003/0160309 A1 | 8/2003 | Punzalan et al. | |

FOREIGN PATENT DOCUMENTS

| | | |
|---|---|---|
| JP | 2-278783 | 11/1990 |
| JP | 9-232690 | 9/1997 |

OTHER PUBLICATIONS

U.S. Appl. No. 10/643,961, Chun Ho Fan et al., "Improved Ball Grid Array Package and Process for Manufacturing Same", filed Aug. 20, 2003.

U.S. Appl. 10/647,696, Mohan Kirloskar et al., "Improved Ball Grid Array Package and Process for Manufacturing Same", filed Aug. 25, 2003.

* cited by examiner

BALL GRID ARRAY PACKAGE AND PROCESS FOR MANUFACTURING SAME

FIELD OF THE INVENTION

The present invention relates in general to integrated circuit packaging, and in particular to an improved ball grid array package with enhanced thermal characteristics and a unique method of manufacturing.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the package is increasingly important.

Figure 1:
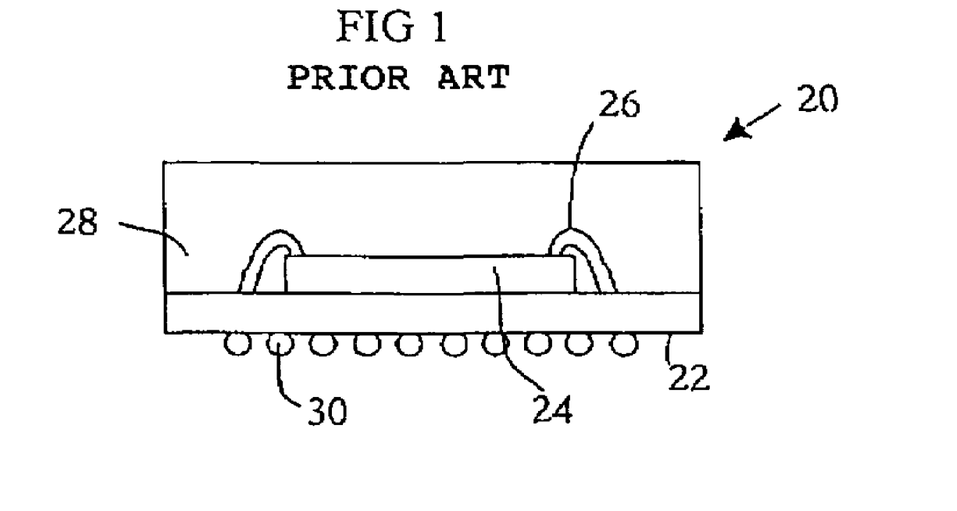
FIG. 1 is an elevation view of a conventional plastic ball grid array package.

Reference is made to FIG. 1, which shows an elevation view of a conventional PBGA package indicated generally by the numeral 20. The PBGA package 20 includes a substrate 22 and a semiconductor die 24 attached to the substrate 22 by a die adhesive. Gold wire bonds 26 electrically connect the die 24 to metal traces on the substrate 22. The wire bonds 26 and die 24 are encapsulated in an overmold material 28. A ball grid array 30, in the form of solder bumps, is disposed on the bottom surface of the substrate 22 for signal transfer. Because of the absence of a thermal path away from the semiconductor die 24, thermal dissipation in this package is poor.

Figure 2:
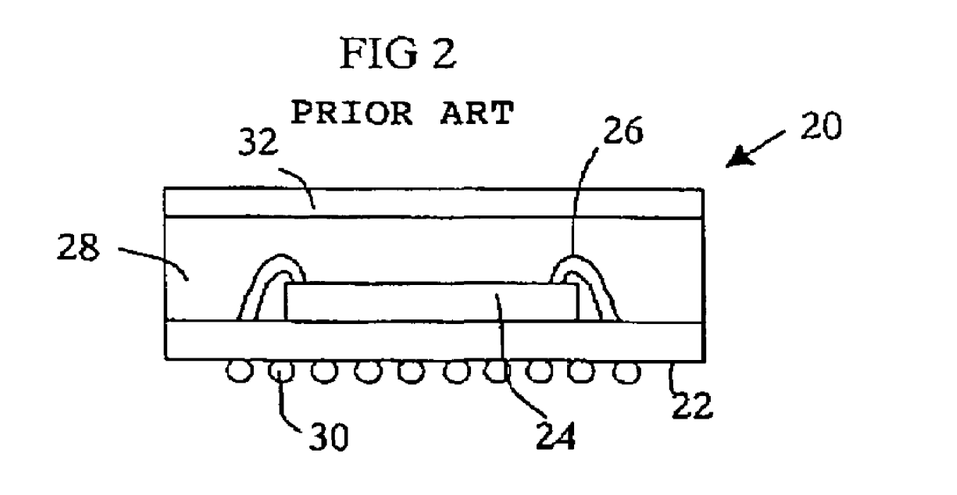
FIG. 2 is an elevation view of a prior art plastic ball grid array package including a heat spreader.

Variations to conventional BGA packages have been proposed for the purpose of increasing thermal and electrical performance. One particular variation includes the addition of a metal heat spreader to the package, as shown in FIG. 2 which shows an elevation view of a PBGA package 20 of the prior art including the heat spreader indicated by the numeral 32. In general, the metal heat spreader 32 is fixed to the molded package. This package suffers disadvantages, however, as heat must be dissipated from the semiconductor die 24, through the molding compound 28 and then through the heat spreader 32. Furthermore, this package is not suitable for package stacking which is desirable for decreasing motherboard area that is used when the packages are mounted thereon.

It is therefore an object of an aspect of the present invention to provide a process for manufacturing a BGA package that obviates or mitigates at least some of the disadvantages of the prior art.

SUMMARY OF THE INVENTION

In one aspect, a process for manufacturing an integrated circuit package is provided. The process includes forming a plurality of solder balls on a first surface of a substrate and mounting a semiconductor die to the substrate such that bumps of the semiconductor die are electrically connected to conductive traces of the substrate. The semiconductor die and the solder balls are encapsulated in an overmold material on the substrate such that portions of the solder balls are exposed. A ball grid array is formed such that bumps of the ball grid array are electrically connected to the conductive traces and the integrated circuit package is singulated.

In another aspect, an integrated circuit package is provided. The package includes a substrate having a plurality of conductive traces and a plurality of solder balls disposed on a first surface of the substrate. A semiconductor die is mounted to the substrate such that bumps of the semiconductor die are electrically connected to conductive traces of the substrate. An overmold material encapsulates the semiconductor die and the solder balls on the substrate such that portions of the solder balls are exposed. A ball grid array is in electrical connection with the conductive traces.

Advantageously, solder balls are embedded in the overmold material. The solder balls provide a heat path for heat dissipation from the package. Also, the solder balls in the overmold material enable package stacking which provides for reduced mother board area when the packages are in use and improves package to package communication signal paths.

In another aspect, bumps of a ball grid array are mounted on solder balls which are encapsulated in overmold material. This package provides better control of solder ball stand off clearance than prior art packages.

DETAILED DESCRIPTION OF THE PREFERRED EMBODIMENTS

Reference is now made to FIGS. 3A to 3G to describe a process for manufacturing a ball grid array integrated circuit package, referred to herein as a ball grid array package, according to one embodiment of the present invention. To simplify the description, the numerals used previously in describing FIG. 1 will be used again after raising the numerals by 100 where parts to be described correspond to parts already described.

Figure 3A:
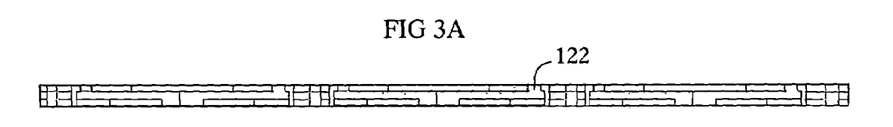
FIGS. 3A to 3G show processing steps for manufacturing a ball grid array package in accordance with one embodiment of the present invention.
Figure 3B:
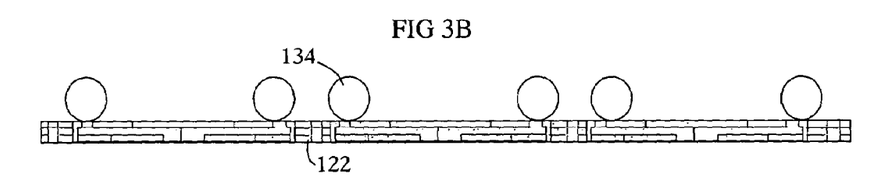
Figure 3C:
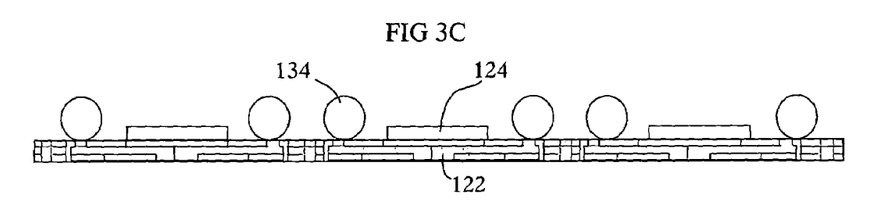
Figure 3D:
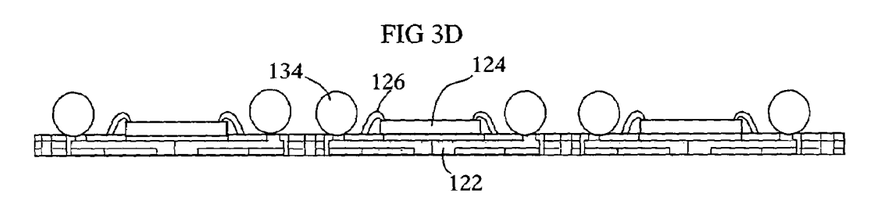
Figure 3E:
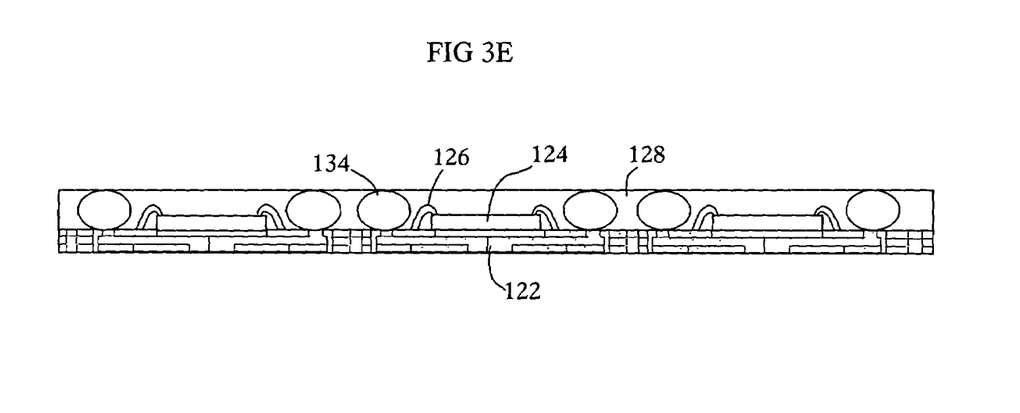
Figure 3F:
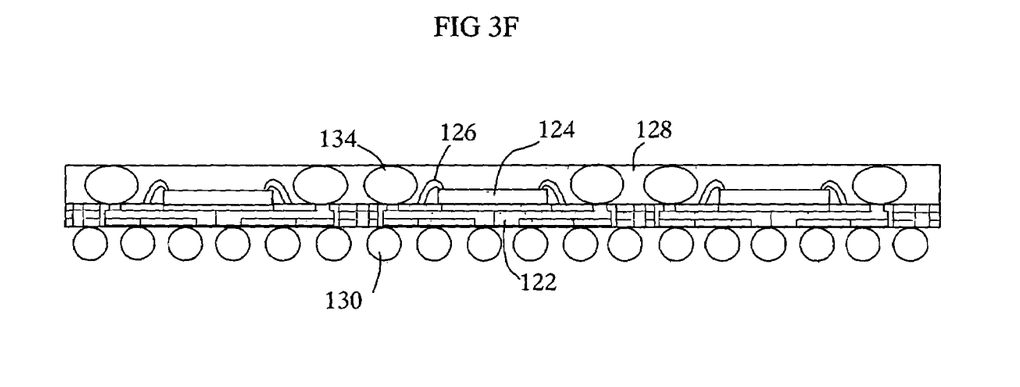
Figure 3G:
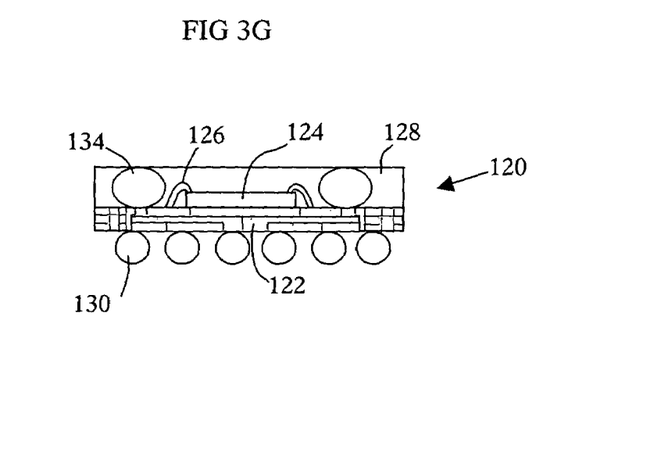

Referring to FIG. 3G, the ball grid array (BGA) package is indicated generally by the numeral 120 and includes a substrate 122 having a plurality of conductive traces and a plurality of solder balls 134 disposed on a first surface of the substrate 122. A semiconductor die 124 is mounted to the substrate 122 such that bumps of the semiconductor die 124 are electrically connected to the conductive traces of the substrate 122. An overmold material 128 encapsulates the semiconductor die 124 and the solder balls 134 on the substrate 122 such that portions of the solder balls 134 are exposed. A ball grid array 130 is electrically connected with the conductive traces of the substrate 122.

The process for manufacturing the ball grid array package 120, according to one embodiment of the present invention, will now be described in more detail. Referring to FIG. 3A, the substrate 122, a BT resin/glass epoxy printed circuit board with conductive traces for signal transfer is shown. A solder mask is disposed on the lower surface of the substrate with portions of the conductive traces, also referred to as interconnects, exposed. The substrate 122 is in the form of an array strip for producing a number of BGA units. Three such units are depicted in an array in FIG. 3A, however, the process is herein described with reference to a single unit.

The plurality of solder balls 134 are formed on solder ball pads on the upper surface of the substrate 122 using conventional positioning techniques (FIG. 3B). To attach the solder balls 134, a flux is added to the solder balls 134 prior to placement and, after placement the solder balls 134 are reflowed using known reflow techniques. The solder balls 134 are thereby connected to the solder ball pads of the substrate 122.

A singulated semiconductor die 124 is conventionally mounted to the upper surface of the substrate 122 using a suitable die attach technique, such as attachment using a die attach epoxy adhesive and curing of the epoxy (FIG. 3C). It will now be understood that the solder balls 134 are located around the periphery of the semiconductor die 124.

The semiconductor die 124 has a conductive pad array formed thereon and wire bonds 126 are bonded between bumps of the conductive pad array of the semiconductor die 124 and the conductive traces of the substrate 122 using conventional wire bonding techniques (FIG. 3D). The semiconductor die 124 is thereby electrically connected to the conductive traces of the substrate 122.

Encapsulation in the overmold material 128 follows. The semiconductor die 124 and the solder balls 134 are encapsulated in the overmold material 128 by molding in a mold die such that portions of the solder balls 134 that are distal the substrate 122, are exposed. The solder balls 134 are deformed into substantially spheroidal shapes during molding as a result of pressure from the surface of the mold die (FIG. 3E).

Next, a ball grid array 130 in the form of solder bumps, is formed on the lower surface of the substrate 122 by conventional positioning (FIG. 3F). To attach the solder bumps of the ball grid array 130, a flux is added to the solder prior to placement and, after placement, the solder is reflowed using known reflow techniques. The solder bumps of the ball grid array 130 are thereby connected to the conductive traces of the substrate 122 and through the wire bonds 126 to the semiconductor die 124. The ball grid array 130 provides signal and power connections as well as ground connections for the semiconductor die 124.

Figure 4:
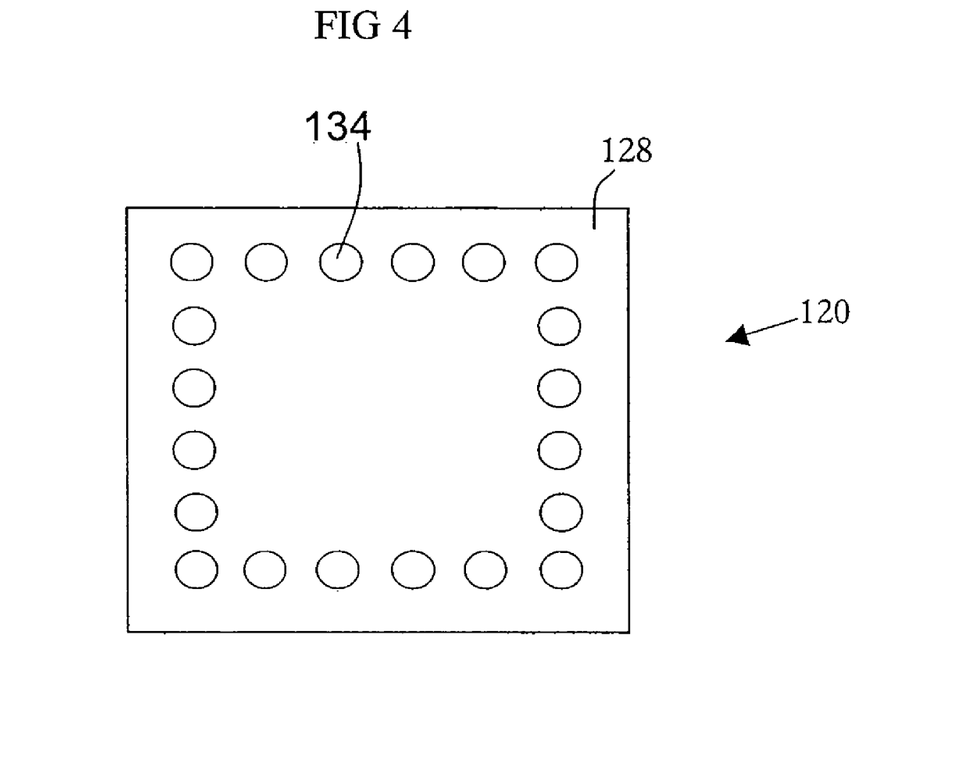
FIG. 4 is a top plan view of the individual BGA package shown in FIG. 3G.

Singulation of the individual BGA unit from the array strip is then performed either by saw singulation or die punching, resulting in the configuration shown in FIG. 3G. Thus, the individual BGA package 120 is isolated from the strip. FIG. 4 shows a top plan view of the individual BGA package shown in FIG. 3G.

Figure 5:
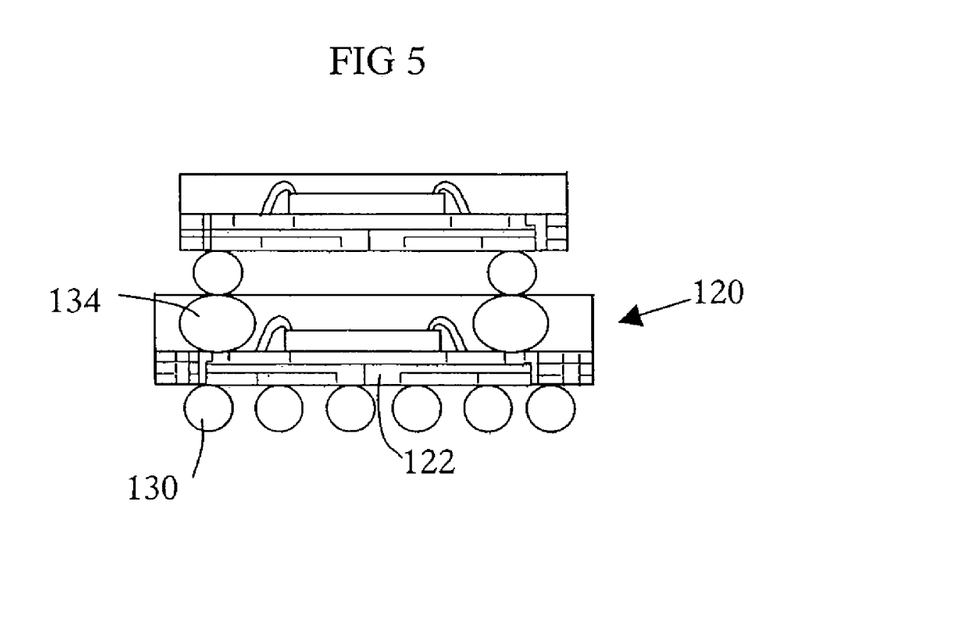
FIG. 5 is a side elevation view of the BGA package of FIG. 3G stacked with another BGA package.

The BGA package 120 produced by this process is particularly suitable for stacking with other BGA packages, as shown in FIG. 5

Figure 6A:
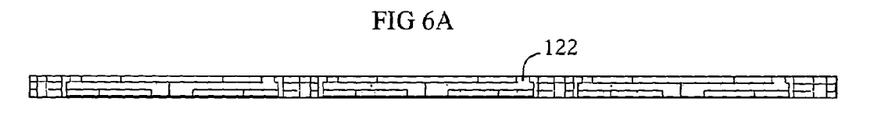
FIGS. 6A to 6I show processing steps for manufacturing a ball grid array package in accordance with another embodiment of the present invention.
Figure 6B:
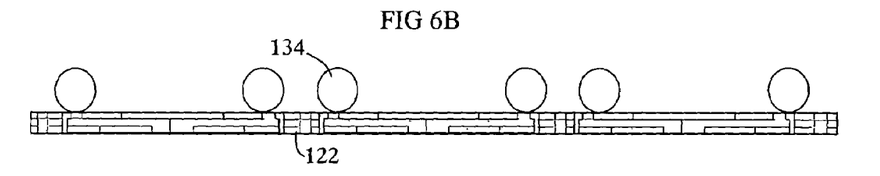
Figure 6C:
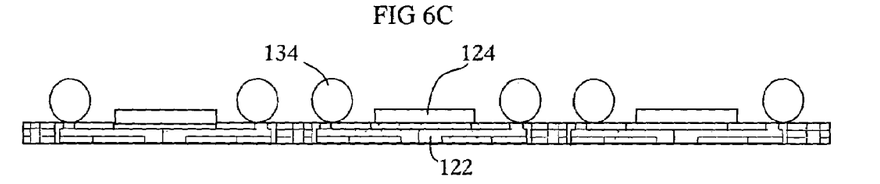
Figure 6D:
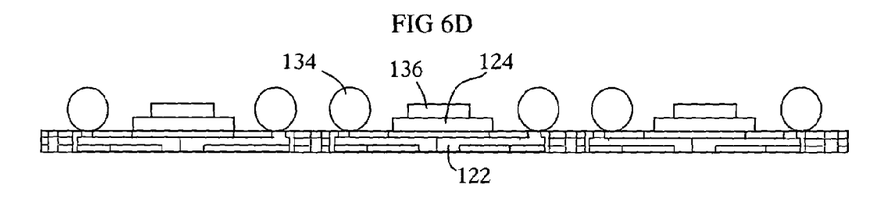
Figure 6E:
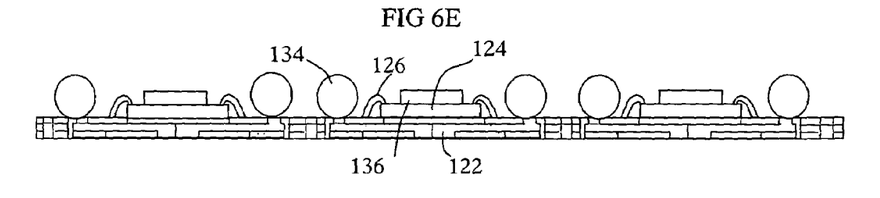
Figure 6F:
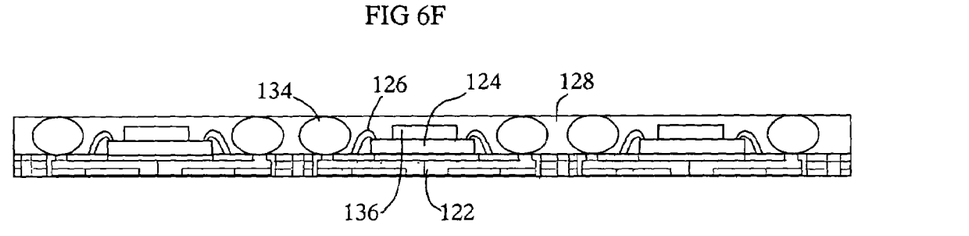
Figure 6G:
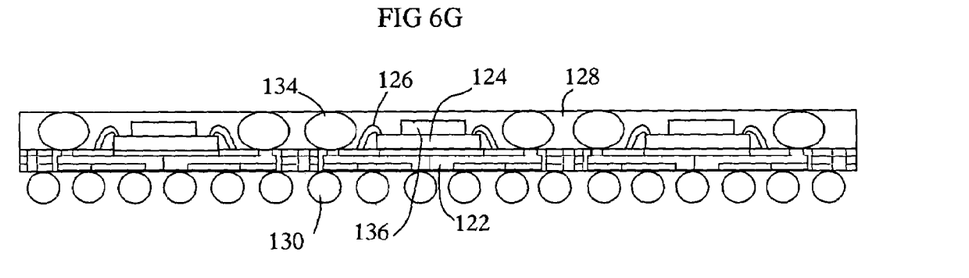
Figure 6H:
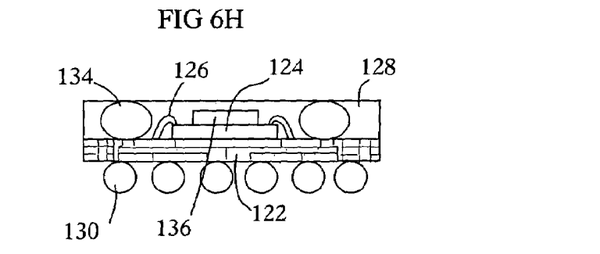

Reference is now made to FIGS. 6A to 6I to describe a process for manufacturing the ball grid array package 120 in accordance with an alternative embodiment of the present invention. FIGS. 6A to 6C are similar to FIGS. 3A to 3C and therefore need not be further described herein. In FIG. 6D, however, a die adapter 136 is mounted to the semiconductor die 124 using a thermally conductive adhesive for conducting heat from the semiconductor die 124 to the die adapter 136. In the present embodiment, the die adapter 136 is copper, however other suitable materials can be used, as will occur to those skilled in the art.

Figure 6I:
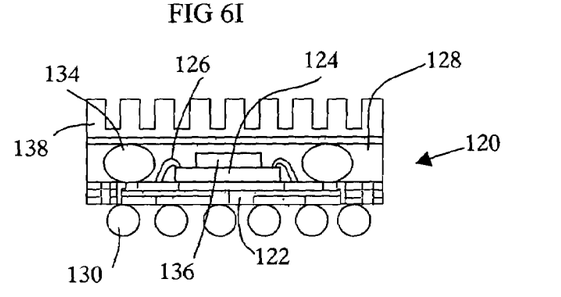

FIGS. 6E to 6H are similar to FIGS. 3D to 3G and therefore need not be further described herein. As shown in FIG. 6I, an external heat sink 138 is then mounted to the package using, for example, a thermally conductive adhesive. Alternatively, the heat sink 138 is soldered to the exposed portions of the solder balls 134. Thus, a heat transfer path is provided through the solder balls 134 to the heat sink 138. The use of a die adapter 136 further improves heat transfer away from the semiconductor die 124.

Figure 7A:
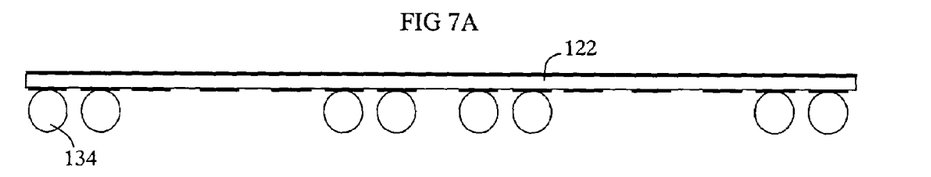
FIGS. 7A to 7G show processing steps for manufacturing a ball grid array package in accordance with another embodiment of the present invention.

Reference is now made to FIGS. 7A to 7G to describe a process for manufacturing a ball grid array package 120 in accordance with another embodiment of the present invention. Referring to FIG. 7A, the substrate 122 of a polyimide tape is shown. The substrate 122 includes a metal layer on both the top side and the bottom side. The metal layer on the top side acts as a heat spreader for dispersing heat while the metal layer on the bottom side includes a circuit pattern of conductive traces for signal transfer. The substrate 122 is in the form of an array strip for producing a number of BGA units. Two such units are depicted in the array in FIG. 7A.

Figure 7B:
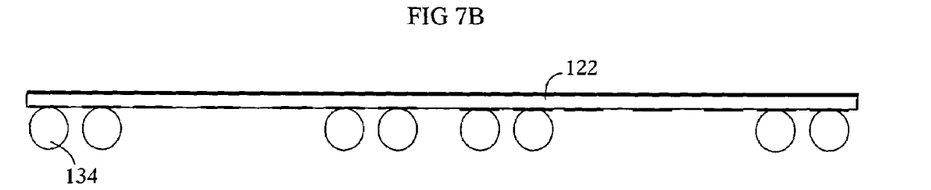

A plurality of solder balls 134 are formed on solder ball pads on the lower surface of the substrate 122 using conventional positioning techniques (FIG. 7B). To attach the solder balls 134, a flux is added to the solder balls 134 prior to placement and, after placement the solder balls 134 are reflowed using known reflow techniques. The solder balls 134 are thereby connected to the solder ball pads of the substrate 122 which are electrically connected to the conductive traces of the substrate 122.

Figure 7C:
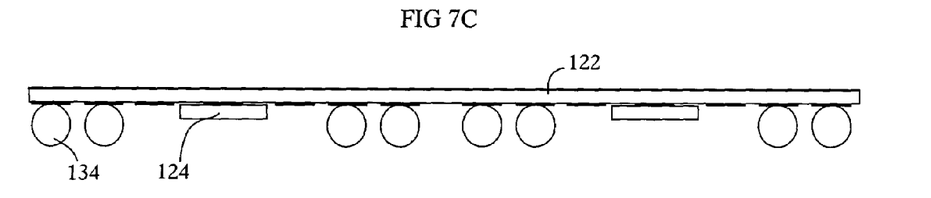

A singulated semiconductor die 124 is conventionally mounted to the lower surface of the substrate 122 using a suitable die attach technique, such as attachment using a die attach epoxy adhesive and curing of the epoxy (FIG. 7C). It will now be understood that the solder balls 134 are located around the periphery of the semiconductor die 124.

Figure 7D:
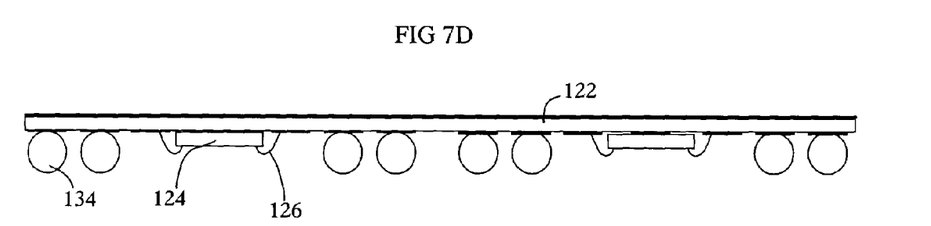

The semiconductor die 124 has a conductive pad array formed thereon and wire bonds 126 are bonded between bumps of the conductive pad array of the semiconductor die 124 and the conductive traces of the substrate 122 using conventional wire bonding techniques (FIG. 7D). The semiconductor die 124 is thereby electrically connected to the conductive traces of the substrate 122.

Figure 7E:
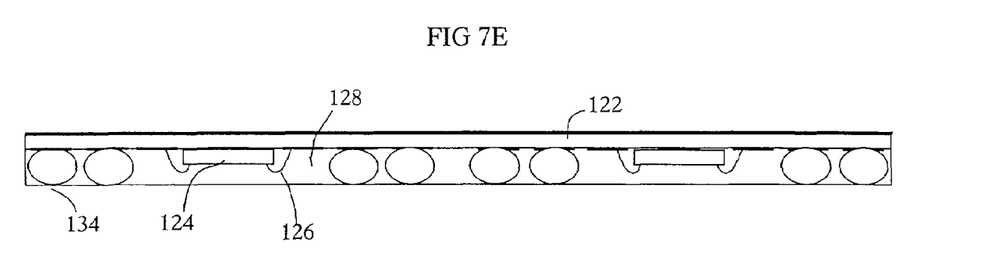

Encapsulation in the overmold material 128 follows. The semiconductor die 124 and the solder balls 134 are encapsulated in the overmold material 128 by molding in a mold die such that portions of the solder balls 134 that are distal the substrate 122, are exposed. The solder balls 134 are deformed into substantially spheroidal shapes during molding as a result of pressure from the surface of the mold die (FIG. 7E).

Figure 7F:
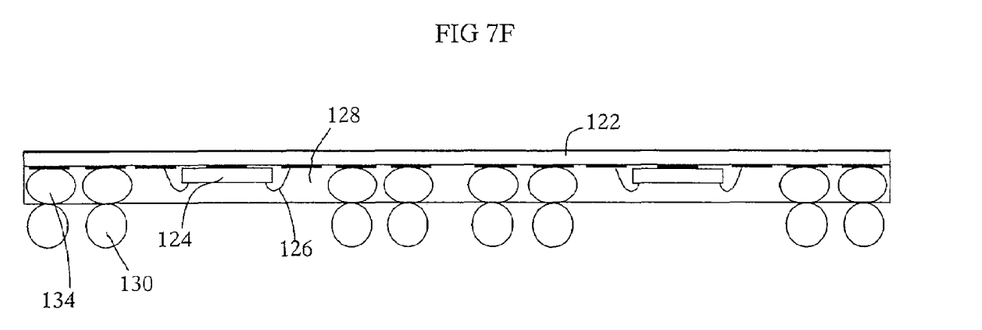

Next, a ball grid array 130 in the form of solder bumps, is formed on the exposed portions of the solder balls 134 by conventional positioning (FIG. 7F). To attach the solder bumps of the ball grid array 130, a flux is added to the solder prior to placement and, after placement, the solder is reflowed using known reflow techniques. The solder bumps of the ball grid array 130 are thereby connected to the conductive traces of the substrate 122 and through the wire bonds 126 to the semiconductor die 124. The ball grid array 130 provides signal and power connections as well as ground connections for the semiconductor die 124.

Figure 7G:
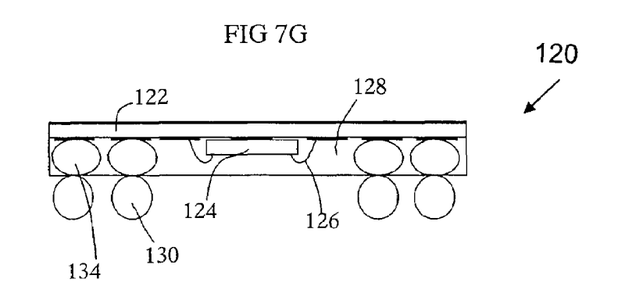

Singulation of the individual BGA unit from the array strip is then performed either by saw singulation or die punching, resulting in the configuration shown in FIG. 7G. Thus, the individual BGA package 120 is isolated from the strip.

Figure 8A:
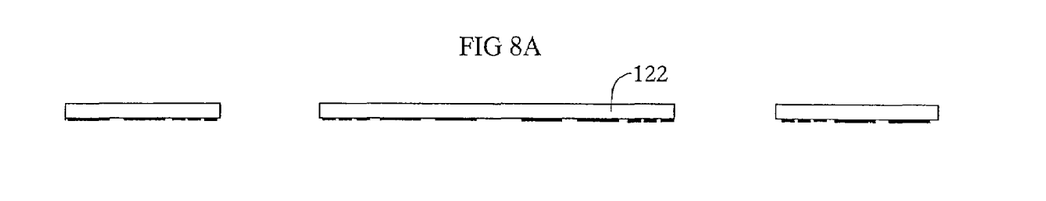
FIGS. 8A to 8H show processing steps for manufacturing a ball grid array package in accordance with still another embodiment of the present invention.

Reference is now made to FIGS. 8A to 8H to describe a process for manufacturing a ball grid array package 120 in accordance with still another embodiment of the present invention. Referring to FIG. 8A, the substrate 122 of a polyimide tape is shown. The substrate 122 includes a metal layer on the bottom side thereof which includes a circuit pattern of conductive traces for signal transfer. A cavity extends through the substrate 122. It will be understood that the substrate 122 is in the form of an array strip for producing a number of BGA units. Two such units are depicted in an array in FIG. 8A, however, the process is herein described with reference to a single unit.

Figure 8B:
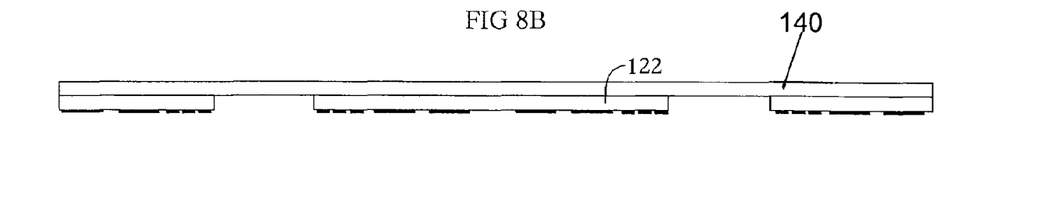

The substrate is laminated to a metal strip 140 which acts as a heat spreader for dispersing heat (FIG. 8B).

Figure 8C:
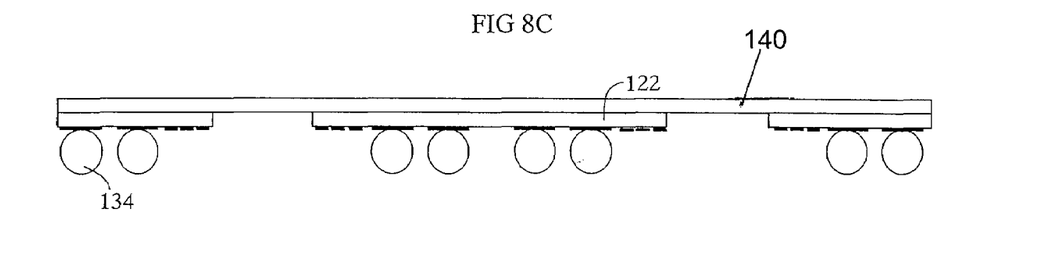

A plurality of solder balls 134 are formed on solder ball pads on the exposed lower surface of the substrate 122 using conventional positioning techniques (FIG. 8C). To attach the solder balls 134, a flux is added to the solder balls 134 prior to placement and, after placement the solder balls 134 are reflowed using known reflow techniques. The solder balls 134 are thereby connected to the solder ball pads of the substrate 122 which are electrically connected to the conductive traces of the substrate 122.

Figure 8D:
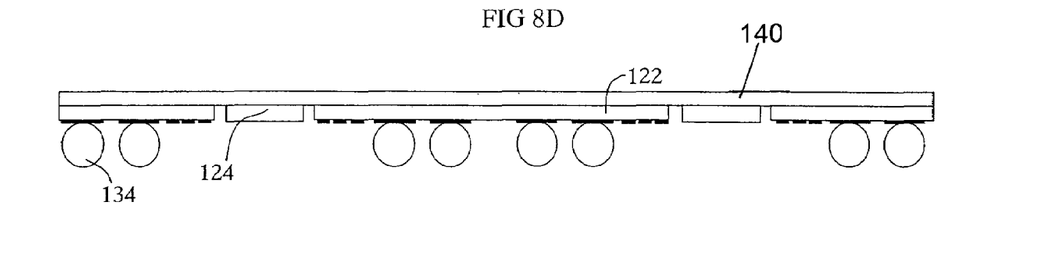

A singulated semiconductor die 124 is mounted to the metal strip 140 which is laminated to the substrate 122, using a suitable die attach technique. Thus, the semiconductor die 124 is attached to the substrate 122 via the metal strip 140 (FIG. 8D). It will now be understood that the solder balls 134 are located around the periphery of the semiconductor die 124.

Figure 8E:
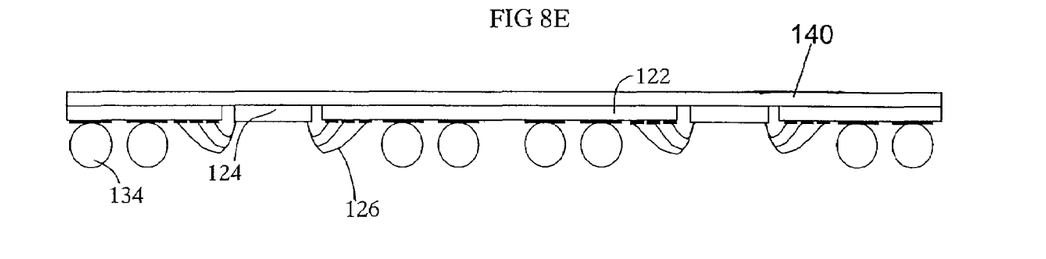

The semiconductor die 124 has a conductive pad array formed thereon and wire bonds 126 are bonded between bumps of the conductive pad array of the semiconductor die 124 and the conductive traces of the substrate 122 using conventional wire bonding techniques (FIG. 8E). The semiconductor die 124 is thereby electrically connected to the conductive traces of the substrate 122.

Figure 8F:
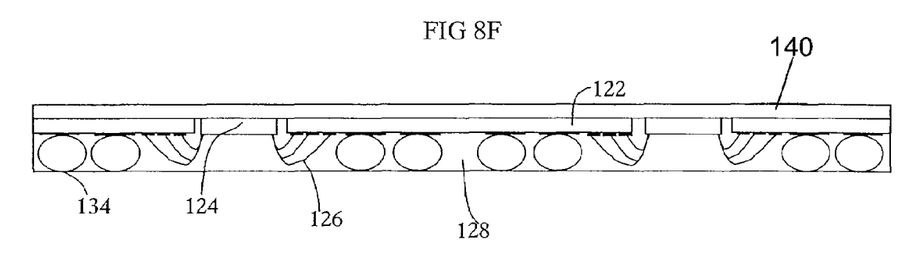

Encapsulation in the overmold material 128 follows. The semiconductor die 124 and the solder balls 134 are encapsulated in the overmold material 128 by molding in a mold die such that portions of the solder balls 134 that are distal the substrate 122, are exposed. The solder balls 134 are deformed into substantially spheroidal shapes during molding as a result of pressure from the surface of the mold die (FIG. 8F).

Figure 8G:
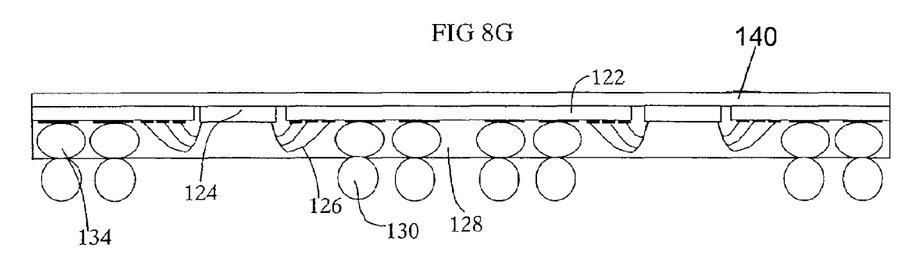

Next, a ball grid array 130 in the form of solder bumps, is formed on the exposed portions of the solder balls 134 by conventional positioning (FIG. 8G). To attach the solder bumps of the ball grid array 130, a flux is added to the solder prior to placement and, after placement, the solder is reflowed using known reflow techniques. The solder bumps of the ball grid array 130 are thereby connected to the conductive traces of the substrate 122 and through the wire bonds 126 to the semiconductor die 124. The ball grid array 134 provides signal and power connections as well as ground connections for the semiconductor die 124.

Figure 8H:
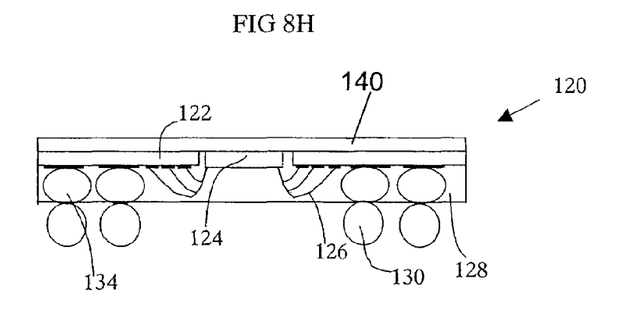

Singulation of the individual BGA unit from the array strip is then performed either by saw singulation or die punching, resulting in the configuration shown in FIG. 8H. Thus, the individual BGA package 120 is isolated from the strip.

Figure 9A:
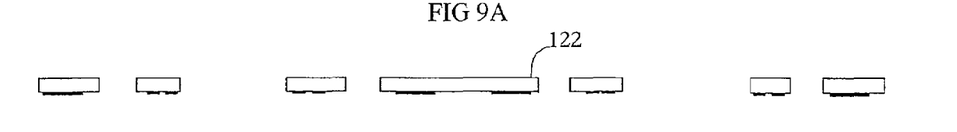
FIGS. 9A to 9I show processing steps for manufacturing a ball grid array package in accordance with yet another embodiment of the present invention.

Reference is now made to FIGS. 9A to 9I to describe a process for manufacturing a ball grid array package 120 in accordance with yet another embodiment of the present invention. Referring to FIG. 9A, the substrate 122 of a polyimide tape is shown. The substrate 122 includes a metal layer on the bottom side thereof which includes a circuit pattern of conductive traces for signal transfer. A cavity extends through the substrate 122 and a plurality of smaller holes also extend through the substrate. It will be understood that the substrate 122 is in the form of an array strip for producing a number of BGA units. Two such units are depicted in an array in FIG. 9A, however, the process is herein described with reference to a single unit.

Figure 9B:
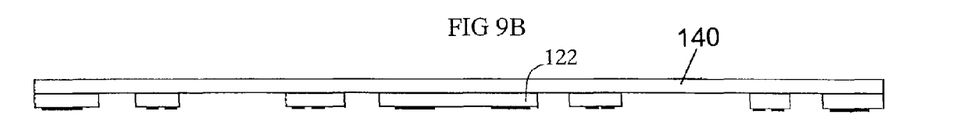

The substrate is laminated to a metal strip 140 that is preplated with suitable metal for ground bonding. Such metal plating includes, for example silver, nickel followed by gold and nickel followed by palladium (FIG. 9B).

Figure 9C:
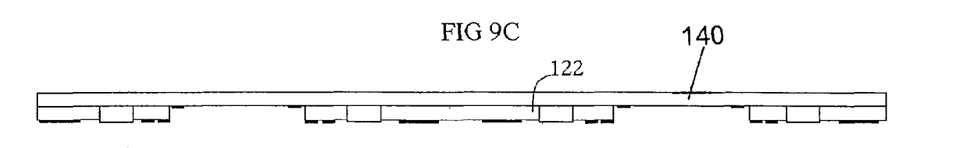

Solder is then applied to the holes of the substrate and the solder is reflowed, followed by a flattening process such as coining to result in a substantially flat surface (FIG. 9C).

Figure 9D:
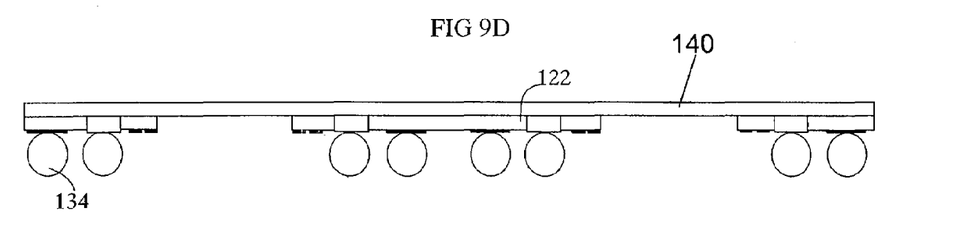

A plurality of solder balls 134 are formed on solder ball pads on the exposed lower surface of the substrate 122 and on the solder in the holes of the substrate 122, using conventional positioning techniques (FIG. 9D). To attach the solder balls 134, a flux is added to the solder balls 134 prior to placement and, after placement the solder balls 134 are reflowed using known reflow techniques. Thus, some of the solder balls 134 are connected to the solder ball pads of the substrate 122 which are electrically connected to the conductive traces of the substrate 122. Others of the solder balls are connected to the metal strip 140.

Figure 9E:
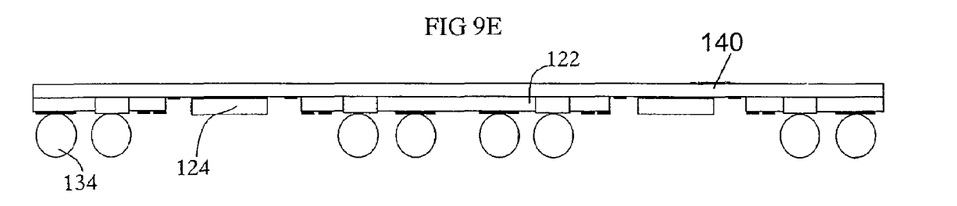

A singulated semiconductor die 124 is mounted to the metal strip 140 which is laminated to the substrate 122, using a suitable die attach technique. Thus, the semiconductor die 124 is attached to the substrate 122 via the metal strip 140 (FIG. 9E). It will now be understood that the solder balls 134 are located around the periphery of the semiconductor die 124.

Figure 9F:
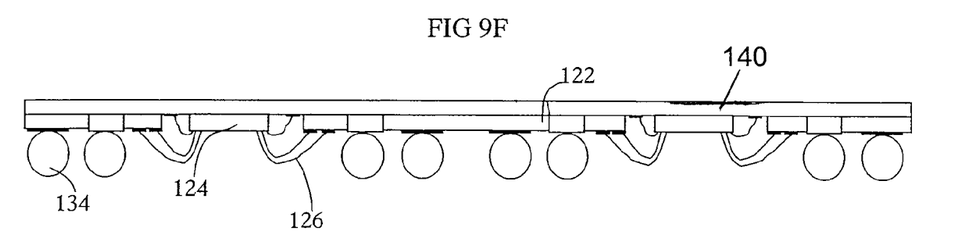

The semiconductor die 124 has a conductive pad array formed thereon and wire bonds 126 are bonded between bumps of the conductive pad array of the semiconductor die 124 and the conductive traces of the substrate 122 using conventional wire bonding techniques (FIG. 9F). The semiconductor die 124 is thereby electrically connected to the conductive traces of the substrate 122.

Figure 9G:
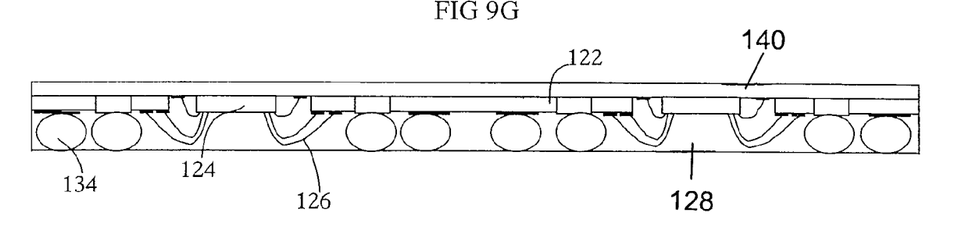

Encapsulation in the overmold material 128 follows. The semiconductor die 124 and the solder balls 134 are encapsulated in the overmold material 128 by molding in a mold die such that portions of the solder balls 134 that are distal the substrate 122, are exposed. The solder balls 134 are deformed into substantially spheroidal shapes during molding as a result of pressure from the surface of the mold die (FIG. 9G).

Figure 9H:
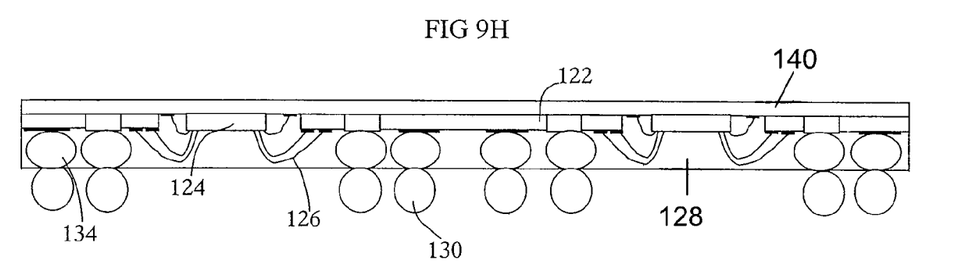

Next, a ball grid array 130 in the form of solder bumps, is formed on the exposed portions of the solder balls 134 by conventional positioning (FIG. 9H). To attach the solder bumps of the ball grid array 130, a flux is added to the solder prior to placement and, after placement, the solder is reflowed using known reflow techniques. Some of the solder bumps of the ball grid array 130 are thereby connected to the conductive traces of the substrate 122 and through the wire bonds 126 to the semiconductor die 124. Other solder bumps of the ball grid array 130 are connected to the metal strip 140. Thus, the solder bumps provide signal and power connections as well as ground connections for the semiconductor die 124.

Figure 9I:
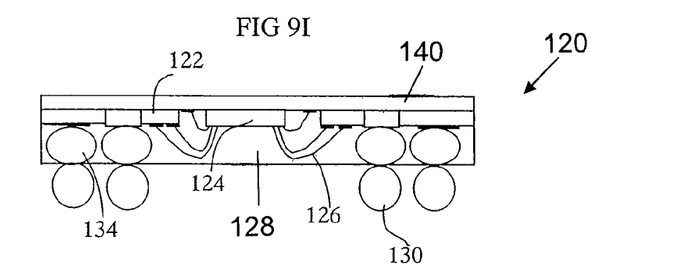

Singulation of the individual BGA unit from the array strip is then performed either by saw singulation or die punching, resulting in the configuration shown in FIG. 9I. Thus, the individual BGA package 120 is isolated from the strip.

Figure 10A:
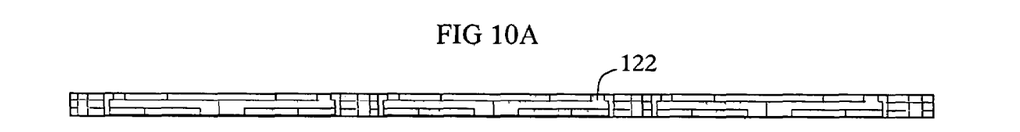
FIGS. 10A to 10G show processing steps for manufacturing a ball grid array package in accordance with another embodiment of the present invention.
Figure 10B:
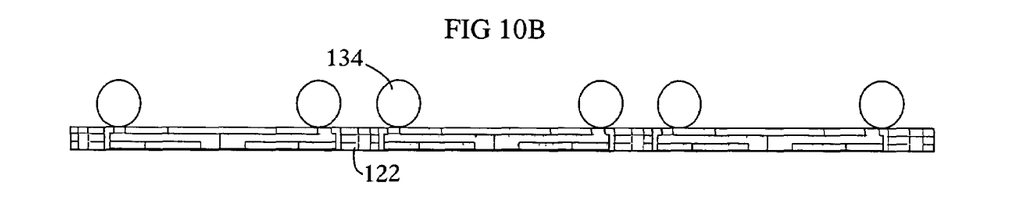
Figure 10C:
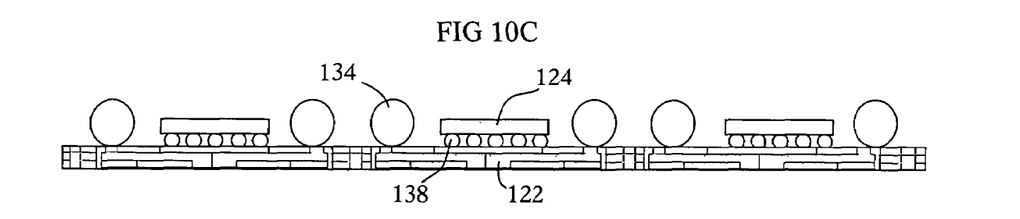

FIGS. 10A to 10G show processing steps for manufacturing a ball grid array package 120 in accordance with another embodiment of the present invention. FIGS. 10A and 10B are similar to FIGS. 3A and 3B and therefore need not be further described herein. In FIG. 10C, however, the semiconductor die 124 is mounted in a flip-chip orientation on the substrate 122. The semiconductor die 124 is mounted to the substrate 122 by solder ball connections 138 between pads of the semiconductor die 124 with interconnect pads of the substrate 122, using known pick and place technique.

Figure 10D:
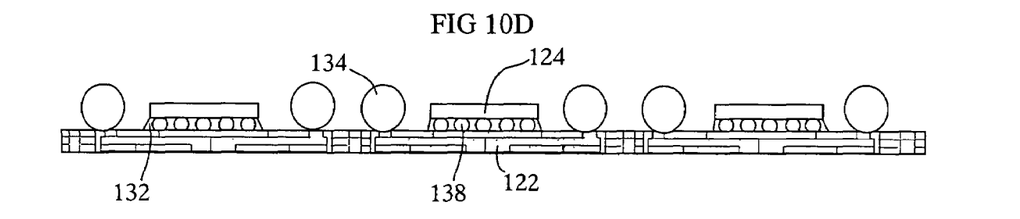

Next, the area under the semiconductor die 124 is filled with a thermosetting plastic compound, referred to generally as an underfill material 132. The underfill material 132 surrounds the solder ball connections 138 that connect the semiconductor die 124 and the interconnect pads of the substrate 122 (FIG. 10D).

Figure 10E:
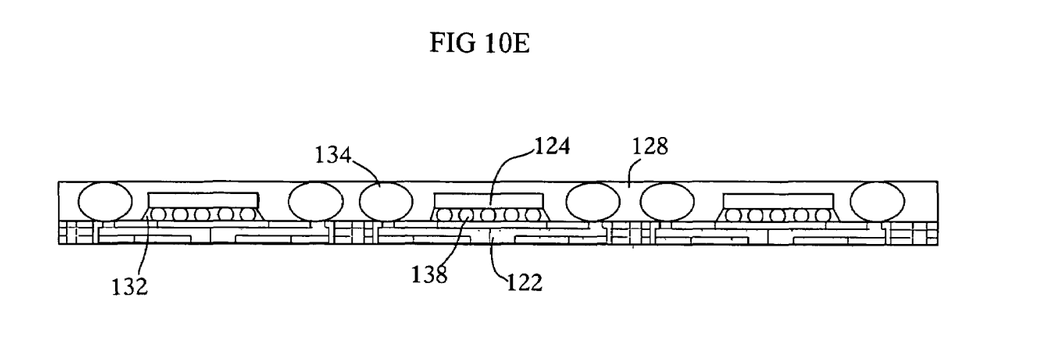
Figure 10F:
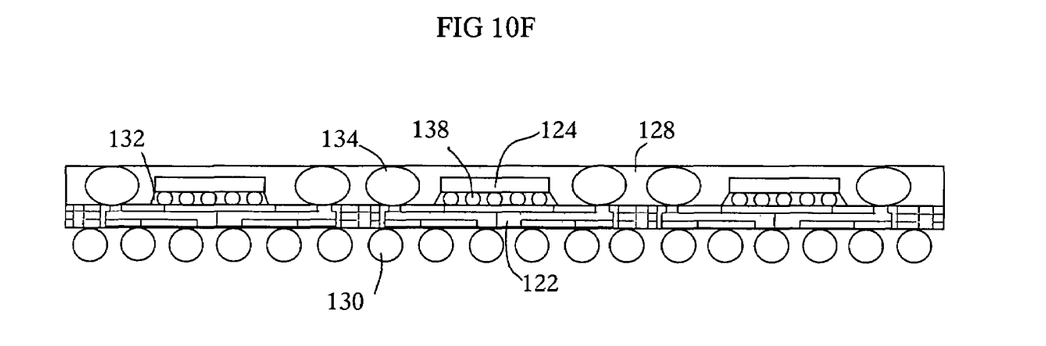
Figure 10G:
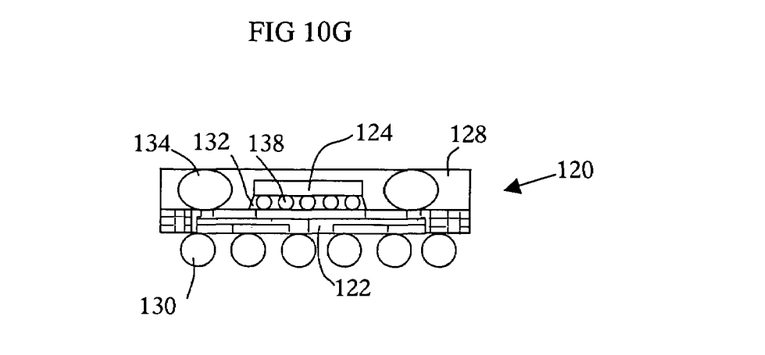

FIGS. 10E to 10G are similar to FIGS. 3E to 3G and therefore need not be further described herein.

Alternative embodiments and variations are possible. For example, the packages described herein have been described as being polyimide and BT resin/glass epoxy printed circuit board substrates. However, other substrates may be used such as ceramic substrates and organic laminates. Also, the size and shape of many of the elements described and shown can vary. Still other embodiments and variations may occur to those skilled in the art. All such embodiments and variations are believed to be within the scope and sphere of the present invention.

What is claimed is:

1. An integrated circuit package comprising: a substrate having a plurality of conductive traces; a plurality of balls disposed on a first surface of said substrate, such that said plurality of balls are electrically connected to said plurality of conductive traces; a semiconductor die mounted to said substrate, such that said semiconductor die is electrically connected to said plurality of conductive traces of said substrate; an overmold material encapsulating said semiconductor die and said balls on said substrate such that portions of said balls that are disposed farthest from said substrate are exposed at an exterior of said integrated circuit package; a ball grid array disposed on a second surface of said substrate and in electrical connection with said conductive traces; and a die adapter mounted on said semiconductor die and encapsulated in said overmold material.

2. The integrated circuit package according to claim 1, wherein said plurality of balls is attached to respective solder ball pads on said first surface of said substrate.

3. The integrated circuit package according to claim 1, wherein said bumps of said semiconductor die are electrically connected to said conductive traces by wire bonds.

4. The integrated circuit package according to claim 1, wherein said semiconductor die is fixed to said first surface of said substrate.

5. The integrated circuit package according to claim 1, wherein said plurality of balls circumscribe said semiconductor die.

6. The integrated circuit package according to claim 1, wherein said balls are deformed.

7. The integrated circuit package according to claim 1, wherein said plurality of balls is comprised of a plurality of solder balls.

8. The integrated circuit package according to claim 1, wherein the semiconductor die is mounted to said substrate via a plurality of solder ball connections.

\* \* \* \* \*